(12) United States Patent
Jungwirth (10) Patent No.: US 10,605,873 B2
(45) Date of Patent: Mar. 31, 2020

(54) APPARATUS FOR MONITORING A MAGNETIC CORE AND METHOD FOR DETECTING A SATURATION BEHAVIOR OF A MAGNETIC CORE TO BE MONITORED

(71) Applicant: SUMIDA COMPONENTS & MODULES GMBH, Obernzell (DE)

(72) Inventor: Herbert Jungwirth, Hauzenberg (DE)

(73) Assignee: Sumida Components & Modules GMBH, Obernzell (DE)

(*) Notice: Subject to any disclaimer, the term of this patent is extended or adjusted under 35 U.S.C. 154(b) by 133 days.

(21) Appl. No.: 15/739,981

(22) PCT Filed: Jul. 1, 2016

(86) PCT No.: PCT/EP2016/065500
§ 371 (c)(1),
(2) Date: Dec. 26, 2017

(87) PCT Pub. No.: WO2017/005624
PCT Pub. Date: Dec. 1, 2017

(65) Prior Publication Data
US 2018/0196112 A1 Jul. 12, 2018

(30) Foreign Application Priority Data

Jul. 3, 2015 (DE) .................. 10 2015 212 497

(51) Int. Cl.
*G01R 33/04* (2006.01)
*G01R 27/26* (2006.01)
(Continued)

(52) U.S. Cl.
CPC ........ *G01R 33/045* (2013.01); *G01R 27/2611* (2013.01); *G01R 33/0029* (2013.01); *G01R 33/123* (2013.01); *G01R 33/1215* (2013.01)

(58) Field of Classification Search
CPC ............ G01R 27/2611; G01R 33/0029; G01R 33/045; G01R 33/1215; G01R 33/123; G01R 31/00; G01R 27/26; G01R 27/267
(Continued)

(56) References Cited

U.S. PATENT DOCUMENTS 4,827,214 A * 5/1989 Nakajima ............ G01R 33/123
  324/222
4,843,310 A   6/1989 Friedl ........................... 324/127
(Continued)

FOREIGN PATENT DOCUMENTS

| CH | 704267      | 6/2012 |
|----|-------------|--------|
| CH | 707221      | 5/2014 |
| JP | 2014-150183 | 8/2014 |

OTHER PUBLICATIONS

Boeck, E., Theoretical Foundations and Their Application for Analyzing Electrotechnical Processes, p. 61-64 (Technische Universitaet Hamburg-Harburg, Institut Fuer Technik, Arbeitsprozesse and Berufliche Bildung 2011) (Year: 2011).*

(Continued)

*Primary Examiner* — Jermele M Hollington
*Assistant Examiner* — Robert P Alejnikov, Jr.
(74) *Attorney, Agent, or Firm* — Fattibene and Fattibene LLC; Paul A. Fattibene (57) ABSTRACT

An apparatus for monitoring a magnetic core, wherein the apparatus provides a measurement winding which is magnetically coupled to the magnetic core to be monitored, a comparison inductance which is electrically connected in series with the winding and an electronic processing unit which is designed to determine the saturation behavior of the magnetic core to be monitored. The electronic processing unit is configured to record a first electrical signal occurring at the measurement winding and a second electrical signal occurring at the comparison inductance in response to an (Continued)

electrical measurement signal applied to the measurement winding, and to determine the saturation behavior of the magnetic core to be monitored on the basis of the first and second electrical signals. This makes it possible to easily monitor the saturation behavior of a magnetic core and to reliably detect the occurrence of saturation of the magnetic core.

16 Claims, 3 Drawing Sheets

(51) Int. Cl.
    *G01R 33/12*     (2006.01)
    *G01R 33/00*     (2006.01)

(58) Field of Classification Search
    USPC .................................................. 324/500, 654
    See application file for complete search history.

(56)     References Cited

U.S. PATENT DOCUMENTS 4,972,146 A     11/1990   Eckardt et al. ............... 324/253
2009/0108833 A1*   4/2009   Ziegler ................ G01R 15/185   324/117 R
2014/0218012 A1*   8/2014   Umetani ............ G01R 33/1215   324/117 R
2015/0276816 A1    10/2015   Yashida et al. ...... G01R 15/185

OTHER PUBLICATIONS

English translation of Notice of Grounds of Rejection in corresponding Japanese Application No. 2017-567424 dated Feb. 12, 2019, 2 pages.

English translation of response to Official Communication from corresponding German application No. 10 2015 212 497.5 dated Apr. 8, 2016, 3 pages.

English translation of Official Communication from corresponding German application No. 10 2015 212 497.5 dated Apr. 8, 2016, 5 pages.

Official Communication from corresponding German application No. 10 2015 212 497.5 dated Apr. 8, 2016, 10 pages.

Boeck, Erich; Skript zur Lehrveranstaltung "Einfuhrung in die Electrotechnik"; Universitat Hamburg-Harburg; 2011; 100 pages.

Jung et al.; Induktive Bauelemente, Massgeschneiderte Speicherdrosseln; 2013; 3 pages.

* cited by examiner

APPARATUS FOR MONITORING A MAGNETIC CORE AND METHOD FOR DETECTING A SATURATION BEHAVIOR OF A MAGNETIC CORE TO BE MONITORED

FIELD OF THE INVENTION

The disclosure generally relates to an apparatus for monitoring a magnetic core and to a method for detecting a saturation behavior of a magnetic core to be monitored. The disclosure in particular relates to monitoring of said saturation behavior of a magnetic core to be monitored.

BACKGROUND

In inductive components, as for example in chokes or transformers, magnetic cores are commonly provided in order to achieve inductance values which in air-core coils (i.e. coils without any core) otherwise would be achievable only with comparatively high numbers of windings and, thus, in turn would result in very high ohmic resistances. Large inductances achievable by means of a magnetic core at relatively low numbers of windings can even be further improved by selecting a suitable core material. Thereby, the permeability, that is, the factor of inductance increase, is targeted adjusted by means of a suitable material. Applications of inductive components with a magnetic core e.g. cover power applications and converters for fuel cells and photovoltaic system.

In general, a good transformation of electrical energy into magnetic energy and vice versa is desired for inductive components with a magnetic core. For example, a very efficient transformation of electrical energy into magnetic energy and vice versa is achieved in coils of chokes and transformers by the magnetic core, since the magnetic core shows a strongly increasing magnetic flux density when applying an external magnetic field. The reason is that the magnetization of a material, when applying an external magnetic field, is increased until microscopically small magnetized domains in the magnetic core, the so-called Weiss domains, have increased to form a Weiss domain extending over the entire magnetic core. As a consequence, the magnetization of a saturated magnetic core cannot be further increased when the applied external magnetic field is increased, and the magnetic flux density in the magnetic core increases only very slowly. In other words, the magnetic permeability of the magnet core approaches the value $\mu=1$ (i.e. the permeability of the vacuum) upon saturation of the core.

Inductive components with a magnetic core going into saturation in operation lead to disadvantages in numerous technical applications. For example, in a transformer, the efficiency of transforming electrical energy into magnetic energy and vice versa decreases when the core goes into saturation so that the efficiency of the transformer is considerably reduced. The occurrence of a saturation in the core is also undesired regarding chokes, since here, the capacity of a choke for temporarily storing energy in the form of a magnetic field drastically decreases. In particular in the course of miniaturizations, saturation limits decrease towards smaller currents and fields.

One possibility to prevent the disadvantageous effects combined with the saturation is to defer the occurrence of saturation to a later time, i.e. a time when applying higher external magnetic fields and higher currents, respectively, as it may be achieved by means of an air gap cut into a magnetic core, for example. Due to the air gap in the core, a slower increase of the magnetic flux density occurs so that the magnetic saturation only occurs at a later point in time (i.e. in case of higher external fields). The reason is that the air gap has a substantially higher magnetic resistance compared to the magnetic core and the magnetization of the material in the magnetic core is effectively impeded. Consequently, the magnetization of a magnetic core increases comparatively more slowly. Since the slow increase of the magnetization is proportional over a comparatively larger range with respect to the applied external field, for many applications this means only an insufficient increase of the field which is externally applied to the magnetic core.

Generally, inductive components are operated in a range in which it is ensured that the core does not go into saturation. Since saturation ranges in the production of magnetic cores cannot be fully taken into account due to process fluctuations, lower limits for external fields and operating currents, respectively, have to be specified in order to avoid undesired saturation during operation. However, this leads to a strong limitation of the controllability of an inductive component.

Therefore, the object is to keep losses in the controllability of inductive components as low as possible.

SUMMARY

The above mentioned problems are solved by an apparatus for monitoring a magnetic core and a method for detecting a saturation behavior of a magnetic core to be monitored, whereby it is possible to determine less stringent limitations for saturation currents. In particular, an "intelligent component" is provided in which an optimal controllability by means of a monitoring and/or determination of a saturation behavior of a magnetic core to be monitored is allowed.

One aspect of the present disclosure provides an apparatus for monitoring a magnetic core, wherein the apparatus provides a measurement winding which is magnetically coupled to the magnetic core to be monitored, a comparison inductance which is electrically connected in series with the winding and an electronic processing unit which is configured to determine the saturation behavior of the magnetic core to be monitored. The electronic processing unit is also configured to record a first electrical signal occurring at the measurement winding and a second electrical signal occurring at the comparison inductance in response to an electrical measurement signal applied to the measurement winding and to determine the saturation behavior of the magnetic core to be monitored on the basis of the first and second electrical signals. This allows to easily monitor the saturation behavior of a magnetic core and to reliably detect the occurrence of saturation of the magnetic core.

In an illustrative embodiment of the first aspect, the electronic processing unit may further be configured to determine a quotient of the first electrical signal and the second electrical signal. This constitutes monitoring which is realizable in a simple manner, wherein e.g. the electronic processing unit can comprise a quotient circuit according to an analog circuit diagram with operational amplifiers.

In a preferred embodiment herein, the electronic processing unit can further be configured to identify a change in the quotient by more than 10% of a constant value of the quotient, preferably by more than 5% or even more than 1%, with a saturation of the magnetic core to be monitored. This provides a very simple criterion for determining the saturation behavior of the magnetic core to be monitored.

In a further illustrative embodiment of the disclosure, the first electrical signal can be a voltage drop over the measurement winding and/or the second electrical signal can be a voltage drop over the comparison inductance. This represents electrical signals which can be easily measured and further processed.

In a further illustrative embodiment of the disclosure, the comparison inductance can comprise a further magnetic core which is different from the magnetic core to be monitored. Thereby, a flexible structure can be achieved, wherein magnetic cores can be easily retrofitted.

In a preferred configuration of this embodiment, the further magnetic core can comprise a saturation current which is greater than the saturation current of the magnetic core to be monitored. Thus, it is efficiently prevented that the saturation behavior of the magnetic core to be monitored is affected disadvantageously by the further magnetic core.

In a further preferred configuration of this embodiment, the comparison inductance can be configured as current transformer. This is a simple way to provide a comparison inductance.

In a further preferred configuration of this embodiment, the further magnetic core can be connected to the magnetic core to be monitored and a magnetic flux density induced by the comparison inductance can be oriented perpendicularly to a flux density induced by the measurement winding in the magnetic core to be monitored. Thereby, a disadvantageous influence of the measurement winding by the comparison inductance is prevented.

In a second aspect of the disclosure, a method for detecting a saturation behavior of a magnetic core to be monitored with a measurement winding is provided, wherein the method comprises applying an electrical measurement signal to the measurement winding, detecting a first electrical signal at the measurement winding in response to the electrical measurement signal, detecting a second electrical signal at a comparison inductance electrically connected in series with the measurement winding in response to the electrical measurement signal, and determining the saturation behavior of the magnetic core to be monitored on the basis of the first and second electrical signal. Thereby, the saturation behavior of the magnetic core is easily monitored and the occurrence of a saturation of the magnetic core is reliably detected.

In an illustrative embodiment herein, the first electrical signal can be detected as a voltage drop over the measurement winding and/or the second electrical signal can be detected as a voltage drop over the comparison inductance. This constitutes a simple manner to detect and process the electrical signals.

In a further descriptive embodiment of the invention, the saturation behavior can be determined on the basis of a quotient from the first electrical signal and the second electrical signal. This allows an easy determination of the saturation behavior by the first and second electrical signals.

In a preferred configuration of this embodiment, a saturation of the magnetic core to be monitored can be identified with a change in the quotient by more than 10% of a constant value of the quotient, for example more than 5% or more than 1%. This represents a simple criterion for determining the saturation behavior.

In a further preferred configuration of this embodiment, the electrical measurement signal can be a current signal and the quotient can be determined as a function of the current signal, wherein the method can further comprise forming a product from the current signal and the quotient and determining a saturation current for a local maximum in an interrelation between the product and the current signal. This represents a further efficient criterion for determining the saturation behavior of the magnetic core to be monitored.

In a further preferred configuration of this embodiment, the electrical measurement signal can be a current signal and the quotient can be detected as a function of the current signal, wherein the method can further comprise forming a product of a square of the current signal and the quotient and determining a saturation current from a local maximum in an interrelation between the product and the current signal. This constitutes an efficient method for determining a saturation behavior of a magnetic core to be monitored.

In a third aspect of the disclosure, a use of the apparatus according to the above described first aspect is provided in a power application or with a transformer, wherein the magnetic core to be monitored forms an inductance in the power application or in the transformer with a winding formed via the same. Thus, during normal operation of an inductor in a power application or in a transformer, e.g. of a fuel cell or a photovoltaic system, the magnetic core of the inductor is monitored. Consequently, a maximum controllability of the inductor during normal operation can be effected which is independent of the predetermined parameters since the inductance is monitored directly during the operation and a deviation in inductance can be reliably detected so that suitable measures can be taken in time, for example, in order to suppress a noticeable saturation behavior of the magnetic core.

SHORT DESCRIPTION OF THE FIGURES

Further preferred and descriptive aspects and embodiments of the present invention arise from the following description with reference to the attached Figures, wherein FIG. 1a schematically shows an inductive component with an apparatus for monitoring a magnetic core.

DETAILED DESCRIPTION OF SEVERAL ILLUSTRATIVE EMBODIMENTS

In various descriptive embodiments of the disclosure the saturation behavior of a magnetic core is monitored by a measurement winding coupled to the magnetic core to be monitored and a comparison inductance connected in series with the measurement winding. The entry into saturation of the magnetic core to be monitored can be determined by means of at least one measurement signal, wherein the measurement signal is tapped from the measurement winding. In a non-limiting simple example, the quotient can be formed of a voltage dropping over the comparison inductance and over the measurement winding, wherein the quotient is constant as long as the magnetic core to be monitored is not significantly in saturation. An increasing saturation of the magnetic core leads to an increasing deviation of the quotient from the constant value so that, in the event that the deviation is exceeded to a specific degree, a saturation of the magnetic core to be monitored is indicated.

In several descriptive embodiments an electrical operation of an inductive component can be monitored and controlled, wherein the inductive component comprises the magnetic core to be monitored. For example, a current can be controlled by the inductive component in dependence on the saturation behavior of the magnetic core to monitored, e.g. to that effect that the current flow through the inductive component is reduced proportional to a deviation of the quotient from a constant value and/or proportional to a comparison of the quotient with a predetermined value. This can be achieved directly or indirectly via a controller controlling and/or monitoring the operation of the inductive component.

Exemplary embodiments are now subsequently described with reference to FIGS. 1 to 3.

Figure 1A:
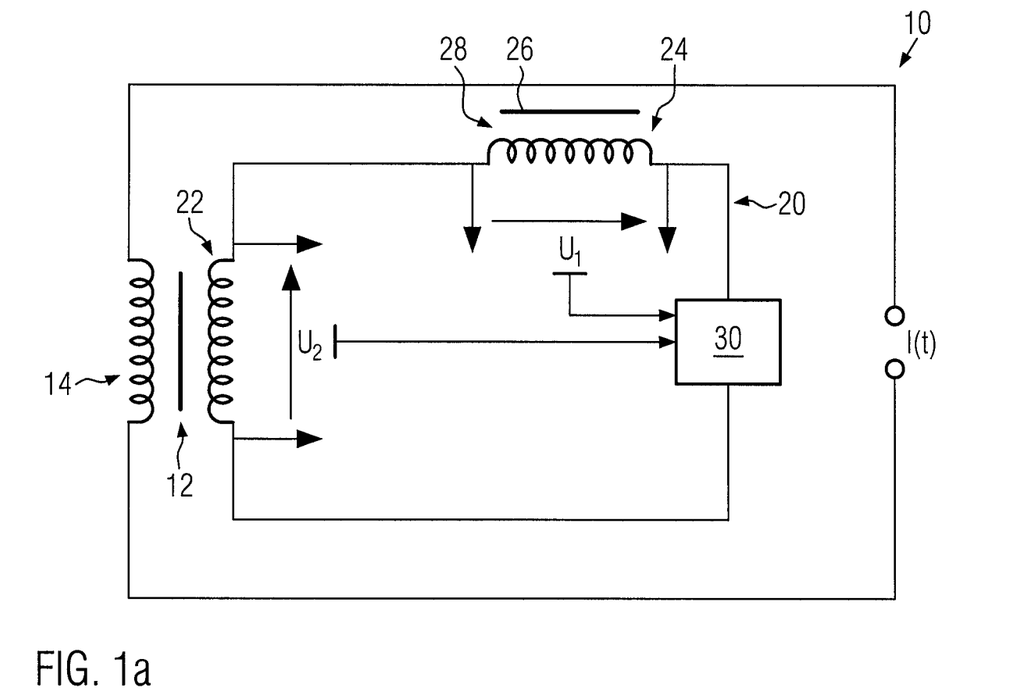

FIG. 1a schematically shows an inductive component 10 comprising a magnetic core 12 to be monitored and a winding 14 arranged over the magnetic core. The inductive component 10 can be provided for power applications or as transformer for a fuel cell or for photovoltaic applications, for example.

For monitoring the magnetic core 12, an apparatus 20 is provided which comprises a measurement winding 22 and a comparison inductance 24 being electrically connected in series with the measurement winding. The apparatus for monitoring the magnetic core 12 further comprises an electronic processing unit 30 which is configured to determine the saturation behavior of the magnetic core 12 to be monitored.

In an exemplary embodiment, the comparison inductance 24 is formed by a winding 28 and a magnetic core 26, wherein the magnetic core 26 differs from the magnetic core 12 to be monitored. According to several illustrative examples, the magnetic core 26 is decoupled from the magnetic core 12 to be monitored, i.e. a magnetic flux density induced by the winding 28 in the magnetic core 26 does not induce any voltage in the measurement winding 22. That is, a voltage induced in the winding 22 by the winding 28 is in particular lower than 20% of a voltage induced by the winding 14 in the measurement winding 22. For example, a voltage induced by the winding 28 in the winding 22 can be smaller than 10% or smaller than 5% or smaller than 1% of the voltage induced in the measurement winding 22 by the winding 14.

The electronic processing unit 30 is coupled with the measurement winding 22 and the comparison inductance so that an electrical signal occurring at the measurement winding 22 or an electrical signal occurring at the comparison inductance 24, e.g. a voltage $U_1$ dropping over the comparison inductance 24, is detected and supplied to the electronic processing unit. According to several exemplary embodiments, the electronic processing unit 30 accordingly comprises a measurement apparatus (not shown) in order to detect electrical signals at the measurement winding 22, such as voltages $U_2$ over the measurement winding 22, and/or at the comparison inductance 24, such as the voltage $U_1$ over the comparison inductance, and to transmit them to the electronic processing unit 30. The electronic processing unit 30 can further comprise a current or voltage source (not shown) and/or current or voltage measurement devices.

According to the illustration in FIG. 1a, the inductive component 10 can be connected with a current source so that a current signal I(t) is applied to the winding 14. For example, the electronic processing unit 30 can be configured so as to detect the current signal I(t) transmitted from the winding 14 via the magnetic core to the measurement winding 22. Alternatively, the electronic processing unit 30 can apply a measurement signal to the measurement winding 22 and/or to the comparison inductance 24, such as a current signal, which is outputted by the electronic processing unit 30, and can detect the electrical signal occurring in response to the outputted measurement signal at the measurement winding 22, for example the voltage $U_2$ dropping over the measurement winding 22, and the electrical signal occurring at the comparison inductance 24, e.g. the voltage $U_1$ dropping over the winding 28. Instead of the current signal I(t), a voltage signal (not shown) can be applied as measurement signal.

According to illustrative embodiments, the electronic processing unit is configured to determine the saturation behavior of the magnetic core 12 to be monitored and, in particular, the saturation behavior of the magnetic core 12 to be monitored on the basis of electrical signals occurring at the measurement winding 22 and the comparison inductance 24, for example, of the voltage $U_2$ dropping over the measurement winding 22 and the voltage $U_1$ dropping over the winding 28 of the comparison inductance 24. Details on a determination of the saturation behavior according to several descriptive embodiments of the invention are further described in more detail with reference to FIGS. 2a and 2c below. Alternatively, instead of the dropping voltage $U_1$ and/or $U_2$, a current flowing through the measurement winding 22 and/or the comparison inductance can be measured as a first and/or second signal.

In a descriptive example, the comparison inductance 24 is provided by a current transformer, wherein a current signal applied to the inductive component 10 is transmitted to the apparatus 20 in a potential-free manner. Thereby, large current signals I(t) may be measured in a potential-free manner.

According to exemplary embodiments of the invention, a saturation current of the core 26 of the comparison inductance 24 is very high. That is, a saturation current of the core 26 of the comparison inductance 24 is herein greater than a saturation current which is to be expected for the magnetic core 12 to be monitored. According to illustrative examples, a saturation current of the magnetic core 26 may be more than twice as large as a saturation current which is to be expected of the magnetic core 12 to be monitored. In specific examples, the saturation current of the magnetic core 26 can be more than 5 times or more than 10 times larger than a saturation current of the magnetic core 12 to be monitored.

Figure 1B:
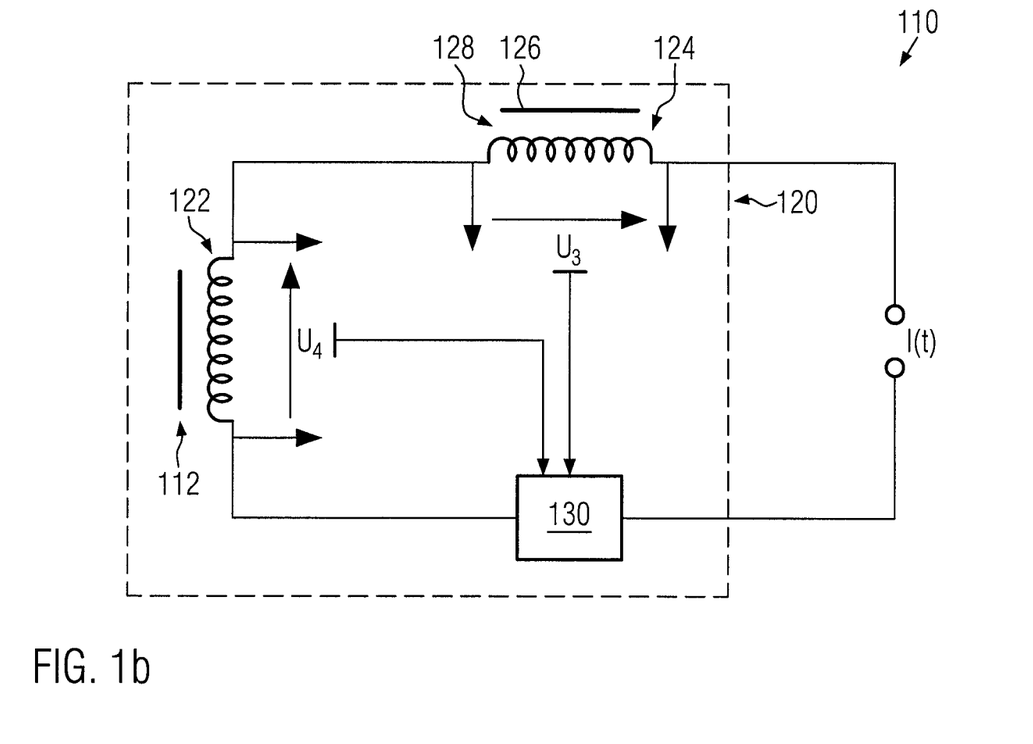
FIG. 1b schematically shows an inductive component with an apparatus for monitoring a magnetic core according to a further illustrative embodiment of the disclosure.

In FIG. 1b, an alternative embodiment of the invention is shown. An inductive component 110, an apparatus 120 for monitoring a magnetic core 112, and a winding 122 are shown which is mounted over the magnetic core 112. The magnetic core 112 comprising the winding 122 may, for example, form a choke for power applications or at least partly a transformer for photovoltaic applications or fuel cells.

The apparatus 120 further comprises a comparison inductance 124 which is electrically connected in series to the winding 122, said winding further being formed by a magnetic core 126 and a winding 128, wherein the magnetic core 126 differs from the magnetic core 112 to be monitored. The apparatus further comprises an electronic processing unit 130 which is configured to detect electrical signals in response to a measurement signal, such as a current signal I(t). In the shown example, the electronic processing unit 130 is configured to measure electrical signals which occur at the winding 122 and at the processing unit 130 by measurement units (not shown), such as a voltage $U_4$ dropping over the winding 122 and a voltage $U_3$ dropping over the winding 128 (alternatively a corresponding current/correspondi ng currents). The signals occurring at the winding 122 and at the comparison inductance 124 are transmitted and/or detected by the electronic processing unit.

The embodiment shown in FIG. 1b differs from the one shown in FIG. 1a in that the apparatus 120 is directly installed into the inductive component 110, and in particular is electrically coupled therewith. In contrast, the apparatus 20 in FIG. 1a is electrically decoupled from the winding 14.

Figure 2A:
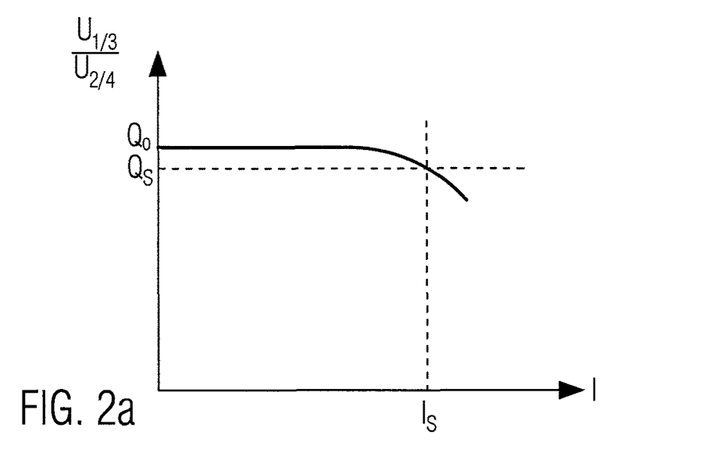
FIG. 2a schematically shows a relation between a quotient of two electrical signals and a current signal according to several illustrative embodiments of the disclosure.
Figure 2B:
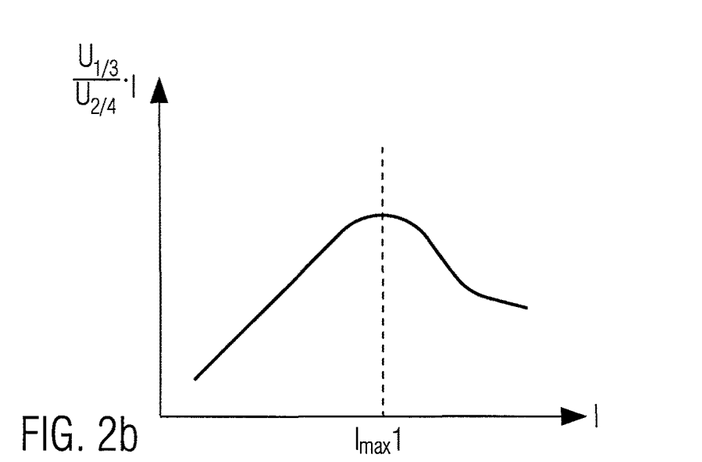
FIG. 2b schematically shows a relation between a current signal and a product of the quotient and the current signal according to several illustrative embodiments of the present disclosure.
Figure 2C:
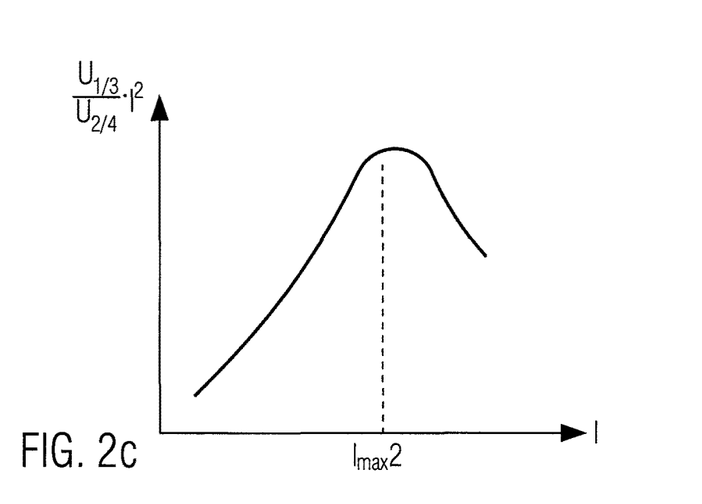
FIG. 2c schematically shows a relation between a current signal and a product of the quotient and the square of the current signal according to several illustrative embodiments of the present disclosure.

With reference to FIGS. 2a to 2c, details for determining the saturation behavior of a magnetic core to be monitored (compare for example magnetic core 12 in FIG. 1a or magnetic core 112 in FIG. 1b) are described according to different descriptive embodiments. It is noted that, for a voltage induced by an inductance, it is: $U(t)=L*(-dI/dt)$, wherein L defines the inductance in Henry and I represents a current signal (dI/dt defines the temporal derivative of I). Thus, an inductance limits the change of the current I when the voltage U(t) is applied.

When defining the inductance of the comparison inductance 24 in FIG. 1a and/or 124 in FIG. 1b by $L_v$ and the inductance of the measurement winding 22 in FIG. 1a and/or 122 in FIG. 22 by $L_m$, a quotient $U_1/U_2$ is equal to $L_v/L_m$ and, thus, constant. For the quotient $U_3/U_4$, this quotient is equal to $L_v/L_m$ and, in particular, constant, as long as none of the magnetic cores 126, 112 is in saturation. In other words, the quotient $U_1/U_2$ and/or $U_3/U_4$ is independent of the applied electrical signal I(t). Upon the magnetic core 12 and/or 112 being in saturation, the voltage dropping at the measurement winding 22 and/or 122 decreases with increasing current and, consequently, the inductance $L_m$ of the measurement winding 22 and/or 122 decreases. Thus, the value of the quotient $U_1/U_2$ and/or $U_3/U_4$ changes and, in particular, deviates from a constant course.

In FIG. 2a, the course of the quotient $U_1/U_2$ and/or $U_3/U_4$ is schematically plotted against the current I. As FIG. 2a shows, the quotient $U_1/U_2$ and/or $U_3/U_4$ is below the saturation limit, i.e. for currents smaller than a saturation current $I_s$, the quotient $U_1/U_2$ and/or $U_3/U_4$ is constant. With increasing saturation of the core 12 and/or 112 to be monitored, the value of the quotient $U_1/U_2$ and/or $U_3/U_4$ deviates from a constant value $Q_0$ and, thus, can be identified as indicating saturation, after a criterion for determining saturation is specified. For example, a deviation from the value $Q_0$ of the quotient $U_1/U_2$ and/or $U_3/U_4$ by more than 10% of $Q_0$, preferably by more than 5% or more than 1% may be identified with a saturation of the magnetic core to be monitored. Thereby, a value $Q_S = a \times Q_0$ is assigned to a saturation current according to a saturation limit $I_S$; thereby the factor "a" generally designates a value smaller than 1, for example lies in a range smaller than 0.1. In an explicit example, it can be defined $Q_S=0.1*Q_0$ or $Q_S=0.05*Q_0$ or $Q_S=0.01*Q_0$. By setting the pair of values $Q_S$, $I_S$, and upon comparing the quotient $U_1/U_2$ and/or $U_3/U_4$ with the current I, the saturation behavior of the magnetic core 12 and/or 112 to be monitored can be determined on the basis of the quotient $U_1/U_2$ and/or $U_3/U_4$, accordingly.

Additionally or alternatively, a determination of a saturation limit can be determined by means of plotting a course of a product of the quotient $U_1/U_2$ with I and/or $U_3/U_4$ with I applied against the current I. Thereby, entry into the saturation of the core 12 and/or 112 to be monitored is visible when the course illustrated in FIG. 2b deviates from a linear relation. A criterion for determining the saturation behavior can be determined by means of a local maximum in the course of the diagram from FIG. 2b, e.g. the position of the local maximum $I_{max1}$ is specified as saturation current limit. In the course shown in FIG. 2b, a local maximum hereby indicates a point at which a change in the inductance $L_m$ is compensated by a change in the current. As of the current $I_{max1}$, a decrease in the inductance $L_m$ has a stronger effect than an increase in the current I, thereby resulting the decreasing course in the diagram of FIG. 2b.

Additionally or alternatively, a determination of the saturation behavior can be derived by means of a course of a product formed from a square of the current I and the quotient $U_1/U_2$ and/or a product from the square of the current signal I and the quotient $U_3/U_4$ against the current U. In this case, an increasing saturation indicates an increasing deviation in the course of a parable shown in FIG. 2c. As criterion for the entry into the saturation and/or as saturation current limit, here, the value of a local maximum in the course can be selected, such as $I_{max2}$ showing a local maximum in the course of the graph of FIG. 2c.

In different illustrative embodiments of the disclosure, an electrical signal is detected at a measurement winding, e.g. at the measurement winding 22 in FIG. 1a or a the measurement winding 122 in FIG. 1b in response to a measurement signal, e.g. the current I(t) in FIGS. 1a and 1b, and compared to an electrical signal at a comparison inductance, e.g. the comparison inductance 24 in FIG. 1a or the comparison inductance 124 in FIG. 1b in order to determine the saturation behavior of a magnetic core to be monitored (e.g. the magnetic core 12 in FIG. 1a or the magnetic core 112 in FIG. 1b).

According to the exemplarily embodiments in FIGS. 2a to 2c, the quotient is determined, for example, from the electrical voltages $U_1/U_2$ and/or $U_3/U_4$. For example, a criterion for determining a saturation limit can be derived from the course of the quotient against the measurement signal or from the course of a factor formed from the quotient against the measurement signal.

According to a special embodiment, details regarding a measurement at a storage choke with ten windings are given. Hereby, for the quotient outside the saturation, it is: 41.10 V/11.13 V=3.69. With increasing current, the quotient changed according to: 42.88 V/12.24 V=3.50→35.16 V/10.54 V=3.34→27.55 V/11.57 V=2.38. As a saturation limit, the value $Q_S$=3.5 was selected which corresponds to a deviation of 5%. This corresponds to a saturation current $I_S$ of about 22.05 A. In other words, by the apparatus according to the invention, a controllability of the exemplarily measured choke storage in the controllable range up to 22.05 A can occur, wherein the inductance changes by less than 5%.

Determining a maximum in a course according to FIG. 2b, lead to a value $I_{max1}$ of 21.5 A. Moreover, for $I_{max2}$, the value of 22.5 A resulted which corresponds in a very good approximation to the 5% criterion.

Figure 3:
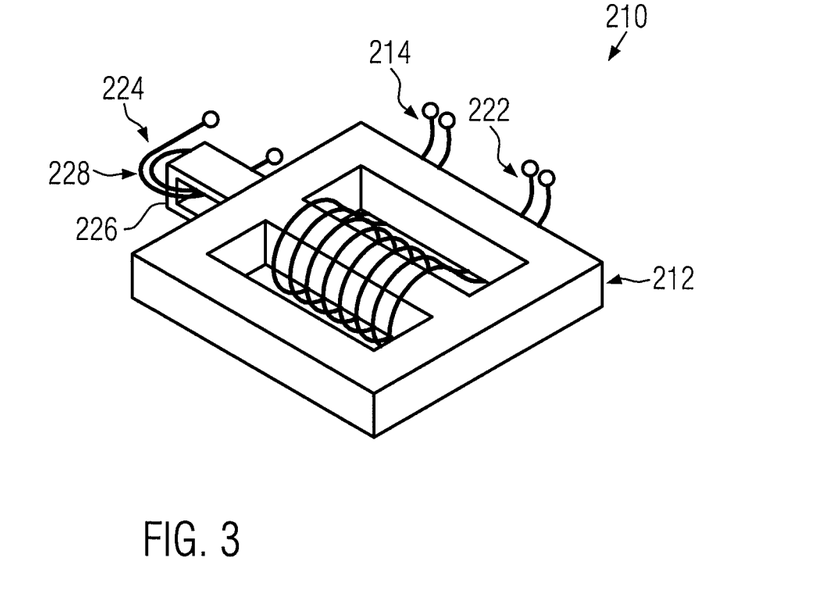
FIG. 3 schematically shows in a perspective view an apparatus for monitoring a magnetic core according to several illustrative embodiments of the disclosure.

In view of FIG. 3, monitoring a storage choke 210 with a choke winding 214 and a magnetic core 212 is described, wherein a measurement winding 222 and a comparison inductance 224 are arranged at the magnetic core 212. The comparison inductance is formed by an additional magnetic core 226 and a winding 228 arranged thereon, wherein the additional magnetic core is arranged at the magnetic core 212 such that a magnetic flux density induced by the comparison inductance 224 in the magnetic core 212 to be monitored is oriented perpendicularly to a magnetic flux density induced by the measurement winding 22 in the core to be monitored. Thus, a reciprocal influence between the magnetic core 212 and the magnetic core 226 is prevented. It is to be noted that the measurement winding 222 is electrically connected in series with the winding 228 as previously described with reference to FIGS. 1a and 1b.

In various aspects, the invention provides an assessment of the saturation and/or a current measurement for monitoring a magnetic core for determining the saturation behavior, wherein in several exemplary embodiments in a measurement winding and, thus, in a comparison inductance, electrically connected in series induced electrical voltages are assessed by means of quotient formation. Thereby, the measurement winding over the magnetic core to be monitored and the comparison inductance provides a proportional output voltage as a function of the current flow change which is used for forming the quotients. Upon reaching the saturation limit of the magnetic core to be monitored, the measurement winding no longer provides a higher voltage. Since the comparison inductance, however, still provides a voltage which proportionally increases with the still increasing current, a criterion results for determining the saturation behavior of the magnetic core to be monitored. According to the previously described descriptive embodiments, the saturation limit can accordingly be determined by means of the quotient formation of two independent voltages. As a condition here, the comparison inductance has a higher saturation limit than the magnetic core to be monitored.

The invention claimed is:

1. An apparatus for monitoring a magnetic core, comprising:
    a measurement winding coupled with the magnetic core to be monitored;
    a comparison inductance electrically connected in series to the measurement winding;
    an electronic processing unit configured to determine the saturation behavior of the magnetic core to be monitored,
    wherein the electronic processing unit is configured to detect a first electrical signal occurring at the measurement winding and a second electrical signal occurring at the comparison inductance in response to an electrical measurement signal applied to the measurement winding and to the comparison inductance, and to determine the saturation behavior of the magnetic core to be monitored on the basis of the first and the second signal; and
    wherein the electronic processing unit is configured to determine a quotient from the first electrical signal and the second electrical signal.

2. The apparatus according to claim 1, wherein the electronic processing unit is configured to identify a change in the quotient by more than 10% of a constant value of the quotient, preferably by more than 5% or by more than 1%, with a saturation of the magnetic core to be monitored.

3. The apparatus according to claim 1, wherein the first electrical signal is a voltage dropping over the measurement winding and/or the second signal is a voltage dropping over the comparison inductance.

4. Application of the apparatus according to claim 1 in a power application or with a transformer, wherein the magnetic core to be monitored forms an inductance in the power application or in the transformer with a winding formed via the same.

5. An apparatus for monitoring a magnetic core, comprising:
    a measurement winding coupled with the magnetic core to be monitored;
    a comparison inductance electrically connected in series to the measurement winding;
    an electronic processing unit configured to determine the saturation behavior of the magnetic core to be monitored,
    wherein the electronic processing unit is configured to detect a first electrical signal occurring at the measurement winding and a second electrical signal occurring at the comparison inductance in response to an electrical measurement signal applied to the measurement winding and to the comparison inductance, and to determine the saturation behavior of the magnetic core to be monitored on the basis of the first and the second signal; and
    wherein the comparison inductance comprises a further magnetic core which is different from the magnetic core to be monitored.

6. The apparatus according to claim 5, wherein the further magnetic core comprises a saturation current which is greater than the saturation current of the magnetic core to be monitored.

7. The apparatus according to claim 5, wherein the comparison inductance is configured as a current transformer.

8. The apparatus according to claim 5, wherein the further magnetic core is connected to the magnetic core to be monitored and a magnetic flux density induced by the comparison inductance in the magnetic core to be monitored is oriented perpendicularly to a flux density induced by the measurement winding in the magnetic core to be monitored.

9. A method for detecting a saturation behavior of a magnetic core to be monitored with a measurement winding, the method comprising:
    applying an electrical measurement signal to the measurement winding;
    detecting a first electrical signal at the measurement winding in response to the electrical measurement signal;
    detecting a second electrical signal at a comparison inductance electrically connected in series with the measurement winding in response to the electrical measurement signal;
    determining the saturation behavior of the magnetic core to be monitored on the basis of the first and second electrical signals; and
    wherein the saturation behavior is determined on the basis of a quotient from the first electrical signal and the second electrical signal.

10. The method according to claim 9, wherein the first electrical signal is detected as an electrical voltage dropping over the measurement winding and/or the second electrical signal as an electrical voltage dropping over the comparison inductance.

11. The method according to claim 9, wherein a saturation of the magnetic core to be monitored is identified with a change in quotient by more than 1% of a constant value of the quotient.

12. The method according to claim 9, wherein the electrical measurement signal is a current signal and the quotient is detected as a function of the current signal, further comprising forming a product from the current signal and the quotient and determining a saturation behavior from a local maximum in an interrelation between the product and the current signal.

13. The method according to claim 9, wherein the electrical measurement signal is a current signal and the quotient is detected as a function of the current signal, further comprising forming a product form a square of the current signal and the quotient and determining a saturation current from a local maximum in an interrelation between the product and the current signal.

14. An apparatus for monitoring a component magnetic core and detecting saturation of an inductive component having a component winding comprising:
   a measurement winding coupled to the component magnetic core;
   a comparison winding connected in series with said measurement winding;
   a comparison magnetic core having a comparison saturation, said comparison saturation being greater than a component saturation of the component magnetic core; and
   a processing unit coupled to said comparison winding and said measurement winding, said processing unit detecting and comparing a measurement signal from said comparison winding and said measurement winding indicative of saturation in each of the component magnetic core and the comparison magnetic core,
   whereby the magnetic component is capable of being monitored and near saturation in the component magnetic core is capable of being detected.

15. The apparatus for monitoring a component magnetic core and detecting saturation of an inductive component having a component winding as in claim 14 wherein:
   the measurement signal is voltage.

16. The apparatus for monitoring a component magnetic core and detecting saturation of an inductive component having a component winding as in claim 14 wherein:
   the measurement signal is current.

* * * * *